(12) United States Patent
Wu et al.

(10) Patent No.: US 10,177,172 B2
(45) Date of Patent: Jan. 8, 2019

(54) ARRAY SUBSTRATE, DISPLAY PANEL AND DISPLAY DEVICE INCLUDING THE SAME

(71) Applicants: Xiamen Tianma Micro-Electronics Co., Ltd, Xiamen (CN); Tianma Micro-Electronics Co., Ltd., Shenzhen (CN)

(72) Inventors: Xiaoxiao Wu, Xiamen (CN); Bingping Liu, Xiamen (CN); Xiufeng Zhou, Xiamen (CN); Xiai Xu, Xiamen (CN); Shoujin Cai, Xiamen (CN); Junyi Li, Xiamen (CN); Guozhao Chen, Xiamen (CN); Poping Shen, Xiamen (CN)

(73) Assignees: Xiamen Tianma Micro-Electronics Co., Ltd., Xiamen (CN); Tianma Micro-Electronics Co., Ltd., Shenzhen (CN)

( * ) Notice: Subject to any disclaimer, the term of this patent is extended or adjusted under 35 U.S.C. 154(b) by 119 days.

(21) Appl. No.: 15/278,045

(22) Filed: Sep. 28, 2016

(65) Prior Publication Data
US 2017/0345845 A1 Nov. 30, 2017

(30) Foreign Application Priority Data
May 27, 2016 (CN) .......................... 2016 1 0367624

(51) Int. Cl.
H01L 27/12 (2006.01)
G09G 3/36 (2006.01)
(Continued)

(52) U.S. Cl.
CPC .......... H01L 27/124 (2013.01); G02F 1/1345 (2013.01); G02F 1/136286 (2013.01);
(Continued)

(58) Field of Classification Search
None
See application file for complete search history.

(56) References Cited

U.S. PATENT DOCUMENTS

2013/0215092 A1* 8/2013 Wu ...................... G09G 3/3225
345/206
2014/0133621 A1* 5/2014 Shang .................. G11C 19/184
377/67
(Continued)

FOREIGN PATENT DOCUMENTS

CN 104570515 A 4/2015

OTHER PUBLICATIONS

Chinese First Office Action dated Jul. 30, 2018 in the corresponding CN application (application No. 201610367624.6).

Primary Examiner — Duane N Taylor, Jr.
(74) Attorney, Agent, or Firm — Kilpatrick Townsend & Stockton LLP

(57) ABSTRACT

An array substrate, and a display panel and display device including the same are disclosed. An embodiment of the array substrate comprises a display region and a non-display region. The non-display region comprises: abase substrate; and a first metal layer, a second metal layer, and a third metal layer arranged in a direction perpendicular to the base substrate. A transistor and a metal line are arranged in the non-display region. A gate electrode of the transistor is located in the first metal layer. A source electrode and a drain electrode of the transistor are located in the second metal layer. The metal line is located in the third metal layer. The orthographic projection of the transistor onto the base substrate overlaps, at least partially, with the orthographic projection of the metal line onto the base substrate.

16 Claims, 8 Drawing Sheets

(51) Int. Cl.
*G02F 1/1345* (2006.01)
*G02F 1/1362* (2006.01)

(52) U.S. Cl.
CPC ... *G09G 3/3677* (2013.01); *G09G 2310/0286* (2013.01); *G09G 2310/0297* (2013.01)

(56) References Cited

U.S. PATENT DOCUMENTS

2016/0372490 A1* 12/2016 Zhang .................. H01L 27/124
2017/0336898 A1* 11/2017 Maede ............. G02F 1/133345

* cited by examiner

ARRAY SUBSTRATE, DISPLAY PANEL AND DISPLAY DEVICE INCLUDING THE SAME

CROSS-REFERENCE TO RELATED APPLICATION

This application claims priority of Chinese Patent Application No. 201610367624.6, filed on May 27, 2016, the content of which is herein incorporated by reference in their entirety.

TECHNICAL FIELD

The disclosure relates to display technology, and in particular, to an array substrate, and a display panel and display device including the same.

BACKGROUND

The display panel usually comprises a display region and a border region surrounding the display region. The border region may be provided with various structures, such as a driving circuit, a common electrode. The driving circuit usually comprises a plurality of thin film transistors and signal lines, and may further comprise other circuit elements, such as capacitors. At present, the border of a liquid crystal display is tended to become increasingly narrower. However, the distribution of the circuit elements and the signal lines in the border region is directly related to the size of the border region.

Reference is made to FIG. 1, which shows a schematic view of an existing layout of the wiring and the transistor in the border region. As shown FIG. 1, the border region comprises a signal line region A1, a transistor region A2, and a common electrode line region A3. Herein, the signal line region A1 may be provided with a plurality of signal lines 224, 225, and 226. The transistor region A2 may be provided with a gate electrode, a source electrode, and a drain electrode of the transistor. The common electrode line region A3 may be provided with a common electrode line 223 connected to the common electrode in parallel. FIG. 2 shows a schematic cross-sectional view of an array substrate containing the structure of the border region shown in FIG. 1. As shown in FIG. 2, the array substrate comprises a display region 2A and a non-display region 2B. The display region 2A comprises a transistor 210, a pixel electrode 24, and a common electrode 26. The non-display region 2B comprises the signal line region A1, the transistor region A2, and the common electrode line region A3. Herein, the signal line region A1 is provided with the signal lines 224, 225, and 226, which may be used as signal lines for a gate driving circuit or a source driving circuit. The signal lines may be, for example, clock signal lines used for transmitting signals for circuit elements in the gate driving circuit or the source driving circuit. The transistor region A2 is provided with a transistor 220 comprising a gate electrode 211, a source electrode 221, and a drain electrode 222. Alternatively, the transistor 220 may further comprise an amorphous silicon layer 25. The common electrode line region A3 is provided with the common electrode line 223 connected to the common electrode 26. It can be viewed from FIG. 2 that the source electrode 221 and the drain electrode 222 of the transistor 220, the common electrode line 223, and the signal lines 224, 225, and 226 are disposed on the same layer in the non-display region 2B, according to the prior design of the array substrate. Besides, the signal line region A1, the transistor region A2, and the common electrode line region A3 are arranged in parallel and do not intersect with each other.

The width of the display device border is determined by the width of the above-mentioned non-display region 2B. In order to guarantee the proper operation of the array substrate, the width of the signal line, the interval between the signal lines, and the width of the common electrode line have certain constraints. Meanwhile, in consideration of the cutting precision during the manufacturing process, it is difficult to further reduce the width of the display device border containing the non-display region 2B, and thus the design of a narrow border is difficult to achieve.

SUMMARY

In view of the above, it is expected to further optimize the layout of the circuit elements and the wiring in the non-display region, thereby reducing the size of the liquid crystal display border. In order to solve the above-mentioned technical problem, the disclosure provides an array substrate, and a display panel and a display device including the same.

In one aspect, the disclosure provides an array substrate, which comprises a display region and a non-display region. The non-display region comprises: a base substrate; and a first metal layer, a second metal layer, and a third metal layer arranged in a direction perpendicular to the base substrate. A transistor and a metal line are arranged in the non-display region. The gate electrode of the transistor is located in the first metal layer. The source electrode and the drain electrode of the transistor are located in the second metal layer. The metal line is located in the third metal layer. The orthographic projection of the transistor onto the base substrate overlaps, at least partially, with the orthographic projection of the metal line onto the base substrate.

In the second aspect, the disclosure provides a display panel, which comprises the above-mentioned array substrate and a color film substrate disposed opposite to the above-mentioned array substrate.

In the third aspect, the disclosure provides a display device, which comprises the above-mentioned display panel.

Since the metal line in the non-display region is arranged at the third metal layer different from the layer at which the gate electrode and the drain electrode of the transistor are arranged, and the orthographic projection of the metal line in the non-display region onto the base substrate overlaps, at least partially, with the orthographic projection of the transistor in the non-display region onto the base substrate, the array substrate, the display panel, and the display device as provided in the disclosure achieve a laminated design of the wiring and the transistor in the non-display region and reduce the total width occupied by the metal line and the transistor in the non-display region, and thus facilitate the design of a narrow border.

BRIEF DESCRIPTION OF THE DRAWINGS

Other features, objects, and advantages of the disclosure will become more apparent from the detailed description of the non-limiting embodiments made in reference to the accompany drawings, in which.

DETAILED DESCRIPTION

Figure 1:
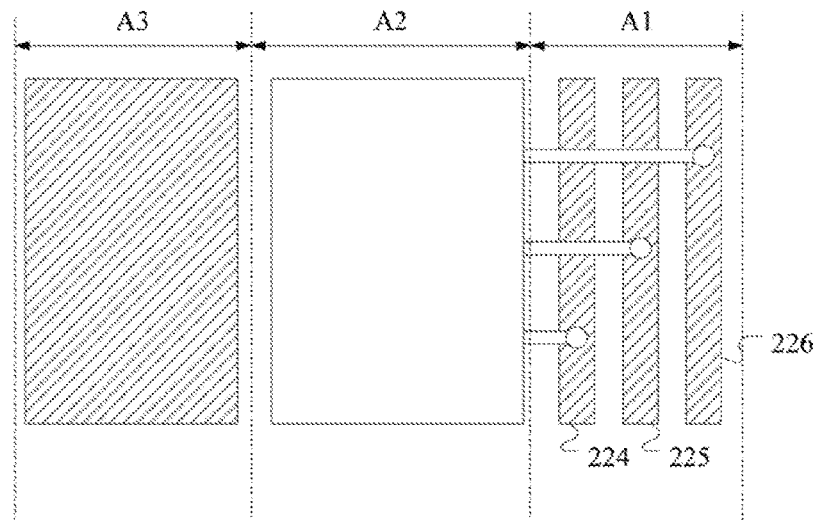
FIG. 1 is a schematic view of a layout of the wiring and the transistor in the border region according to the prior art.
Figure 2:
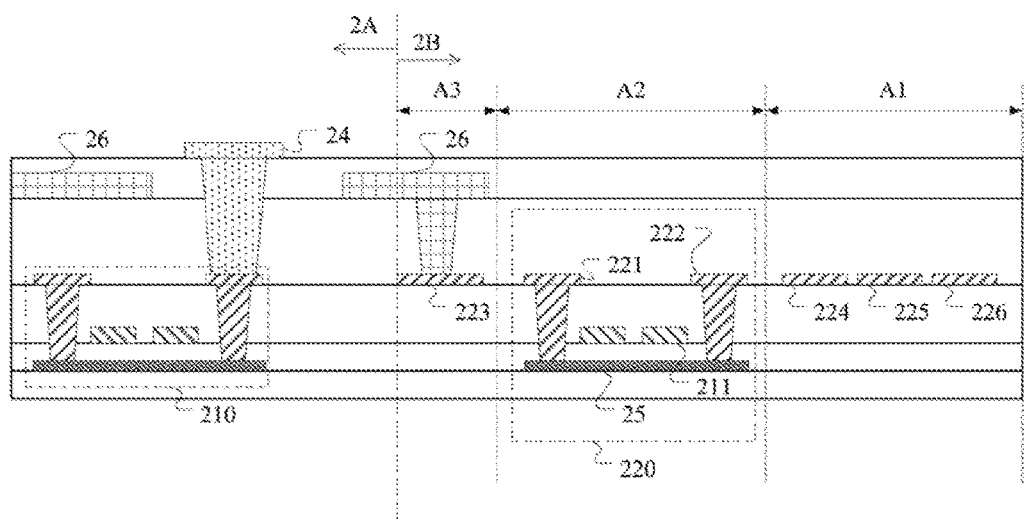
FIG. 2 is a schematic cross-sectional view of an array substrate containing the structure of the border region shown in FIG. 1.

Further description of the disclosure is made below in detail with reference to the accompany drawings and embodiments. It can be understood that the specific embodiments described herein only serves for explaining the involved invention, rather than limiting the invention. In addition, it should be further noted that only the parts associated with the involved invention are illustrated in the drawings for convenience of description.

It should be noted that the features among particular embodiments may be combined with each other, unless there is a conflict. Hereinafter, the disclosure is illustrated in detail with reference to the drawings in combination with embodiments.

Figure 3:
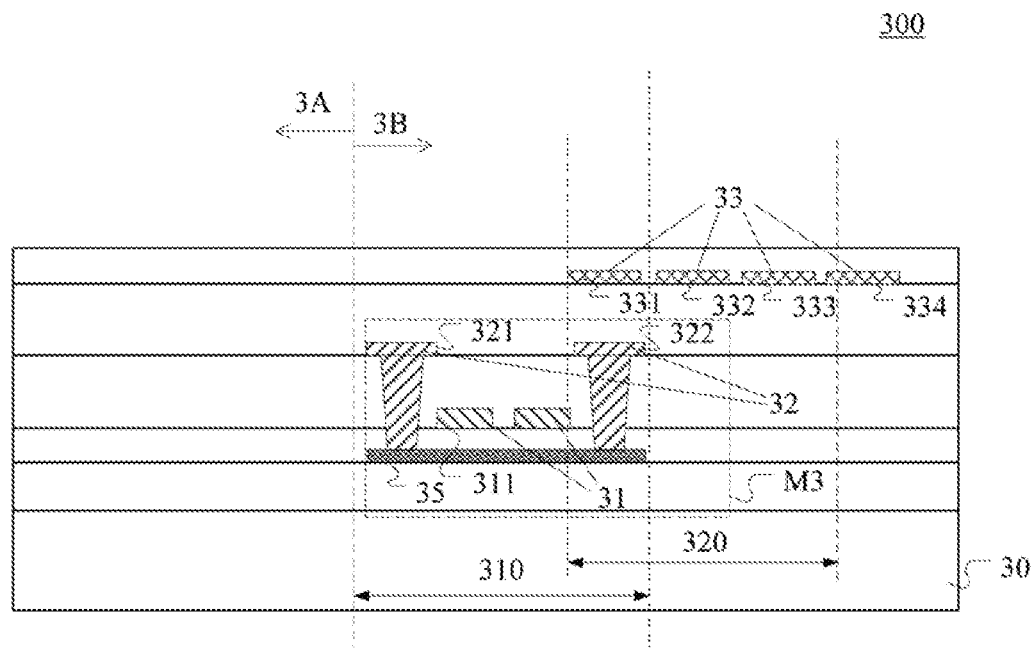
FIG. 3 is a schematic view of a cross-sectional structure of an array substrate according to one embodiment of the disclosure.

Reference is made to FIG. 3, which is a schematic view of a cross-sectional structure of an array substrate according to one embodiment of the disclosure. As shown in FIG. 3, the array substrate 300 comprises a display region 3A and a non-display region 3B. The non-display region 3B comprises: a base substrate 30; and a first metal layer 31, a second metal layer 32, and a third metal layer 33 arranged in a direction perpendicular to the base substrate. A transistor M3 and metal lines 331, 332, 333, and 334 are arranged in the non-display region. A gate electrode 311 of the transistor M3 is located in the first metal layer 31. A source electrode 321 and a drain electrode 322 of the transistor M3 are located in the second metal layer 32. The metal lines 331, 332, 333, and 334 are located in the third metal layer 33. The orthographic projection 310 of the transistor M3 projected onto the base substrate 30 overlaps, at least partially, with the orthographic projection 320 of the metal lines 331, 332, 333, and 334 projected onto the base substrate 30. Furthermore, the orthographic projection 310 of the transistor M3 projected onto the base substrate 30 overlaps, at least partially, with the orthographic projection 320 of the metal lines 331, 332, 333, and 334 projected onto the base substrate 30 in a direction perpendicular to the extension direction of the metal lines 331, 332, 333, and 334.

In this embodiment, the metal lines arranged in the non-display region 3B may be metal lines connected to circuit elements in the non-display region. Furthermore, a driving circuit comprising the transistor M3 and signal lines may be arranged in the non-display region 3B, wherein the signal lines are used for transmitting signals for the transistor M3. The metal lines 331, 332, 333, and 334 may comprise the signal lines in the driving circuit.

Specifically, the signal lines may comprise, for example, a clock signal line or a reset signal line used for transmitting a signal for controlling the on/off state of the transistor M3, a voltage signal line used for transmitting a voltage signal to the transistor M3, an input signal line used for transmitting a gate enabling signal to the transistor M3, a data signal line used for transmitting a data signal to the transistor M3, etc.

A common electrode (not shown in FIG. 3) may be further provided in the display region of the array substrate 300, and the common electrode may be used for providing a common voltage required for the display. The common electrode may be an integral electrode extending from the display region to the non-display region with a large resistance. The metal lines arranged in the non-display region 3B may further comprise a common electrode line. The common electrode line may be connected to the common electrode in parallel so as to reduce the resistance of the common electrode.

In some embodiments, the transistor M3 is a polysilicon thin film transistor. In such a case, the transistor M3 further comprises a polysilicon layer 35. The polysilicon thin film transistor has various advantages, such as, a high mobility, a fast response, a robust resistance to light interference, a high resolution, a small size, etc., thus being suitable for the design of a display panel with a narrow border and a high-resolution.

It should be noted that FIG. 3 schematically shows a schematic view of a position relationship between one transistor M3 and the metal lines 331, 332, 333, and 334. However, in practical applications, the number of the transistor M3 may be more than one, the orthographic projection 310 of the transistor M3 projected onto the base substrate 30 shown in FIG. 3 may be an orthographic projection of a plurality of transistors in the non-display region projected onto the base substrate 30, and the number of the metal lines may be an arbitrary positive integer, which are not limited in the disclosure.

It can be viewed from FIG. 3 that the metal lines 331, 332, 333, and 334 in the non-display region 3B are arranged at a different metal layer from the layer at which the source electrode 321 and the drain electrode 322 of the transistor M3 are arranged. Besides, the orthographic projection 310 of the transistor M3 onto the base substrate 30 overlaps with the orthographic projection 320 of the metal lines 331, 332, 333, and 334 onto the base substrate. Therefore, the total width occupied by the transistor M3 and the metal lines 331, 332, 333, and 334 in the non-display region 3B is reduced, which facilitates the design of a narrow border.

Figure 4:
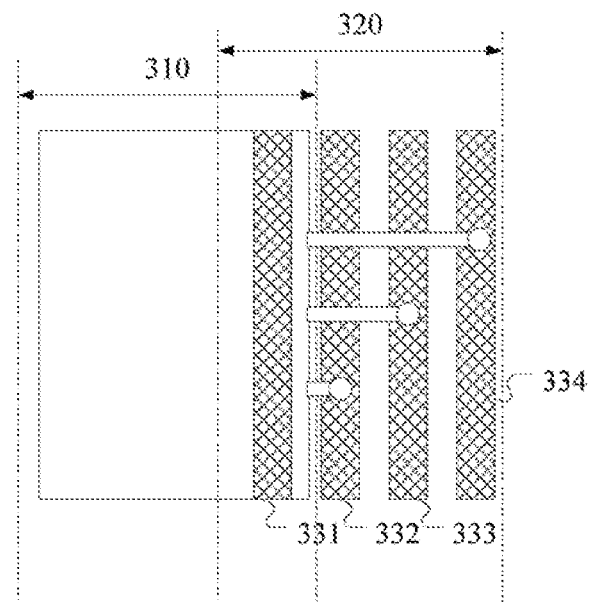
FIG. 4 is a schematic view of an orthographic projection of the non-display region of the array substrate shown in FIG. 3 projected onto the base substrate.

Reference is further made to FIG. 4, which is a schematic view of an orthographic projection of the non-display region of the array substrate shown in FIG. 3 projected onto the base substrate. As shown in FIG. 4, the orthographic projection 310 of the transistor M3 onto the base substrate 30 overlaps, at least partially, with the orthographic projection 320 of the metal lines 331, 332, 333, and 334 onto the base substrate. The total width of the border occupied by the transistor M3 and the metal lines 331, 332, 333, and 334 is less than the sum of widths of 310 and 320. Compared with the solution in the prior art of arranging the source electrode and the drain electrode of the transistor, the signal lines, and the common electrode line at a same metal layer in parallel, the disclosure effectively utilizes the space of the non-display region in the plane perpendicular to the base substrate. Therefore, the total width of the border occupied by the transistor and the metal line in the non-display region is reduced.

Figure 5:
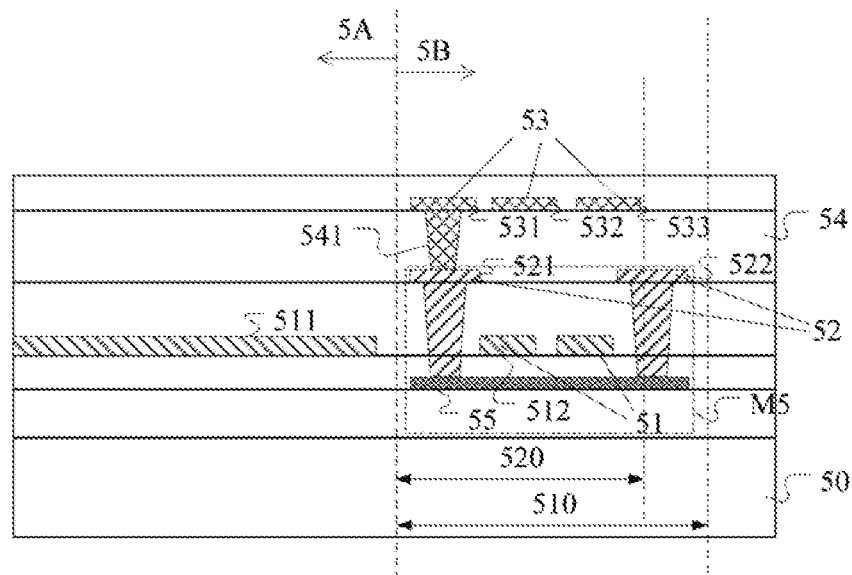
FIG. 5 is a schematic view of a cross-sectional structure of an array substrate according to another embodiment of the disclosure.

In some embodiments, the above-mentioned driving circuit comprises a gate driving circuit. Reference is made to FIG. 5, which is a schematic view of a cross-sectional structure of an array substrate according to another embodiment of the disclosure. As shown in FIG. 5, the array substrate 500 comprises a display region 5A and a non-display region 5B. The non-display region 5B comprises: a base substrate 50; and a first metal layer 51, a second metal layer 52, and a third metal layer 53 arranged in a direction perpendicular to the base substrate. In this embodiment, a transistor M5 and metal lines 531, 532, and 533 are arranged in the non-display region 5B. A gate electrode 512 of the transistor M5 is located in the first metal layer 51. A source electrode 521 and a drain electrode 522 of the transistor M5 are located in the second metal layer 52. The metal lines 531, 532, and 533 are located in the third metal layer 53. The orthographic projection 510 of the transistor M5 onto the base substrate 50 overlaps, at least partially, with the orthographic projection 520 of the metal lines 531, 532, and 533 onto the base substrate 50. Furthermore, the orthographic projection 510 of the transistor M5 onto the base substrate 50 overlaps, at least partially, with the orthographic projection 520 of the metal lines 531, 532, and 533 onto the base substrate 50 in a direction perpendicular to the extension direction of the metal lines 531, 532, and 533. Alternatively, the transistor M5 is a polysilicon thin film transistor. In such a case, the transistor M5 further comprises a polysilicon layer 55.

In this embodiment, a driving circuit is arranged in the non-display region 5B, and the driving circuit comprises a gate driving circuit. The gate driving circuit comprises the transistor M5 and signal lines. The metal lines 531, 532, and 533 may be the signal lines in the gate driving circuit. Furthermore, the gate driving circuit comprises a first clock signal line, a second clock signal line, a first voltage signal line, a second voltage signal line, an input signal line, and a reset signal line. The metal lines 531, 532, and 533 in the above-mentioned array substrate 500 may comprise at least one of the first clock signal line, the second clock signal line, the first voltage signal line, the second voltage signal line, the input signal line, and the reset signal line.

The gate driving circuit may comprise a plurality of cascaded shift register units. Each shift register unit comprises: a plurality of transistors; and the first clock signal line, the second clock signal line, the first voltage signal line, the second voltage signal line, the input signal line, and the reset signal line described above. Herein, the first clock signal line and the second clock signal line are used for transmitting clock signals to the shift register unit in each hierarchy. The first voltage signal line and the second voltage signal line are used for transmitting a first voltage signal and a second voltage signal to the shift register unit in each hierarchy, respectively. The first voltage signal and the second voltage signal may be constant voltage signals having different voltage values. The input signal line may be used for transmitting a gate shift enabling signal to the shift register unit in the first hierarchy. The reset signal line may be used for transmitting a reset signal to the shift register unit in each hierarchy. The signal outputted from the shift register unit may be reset under the control of the reset signal. At least one signal line among the first clock signal line, the second clock signal line, the first voltage signal line, the second voltage signal line, the input signal line, and the reset signal line may be arranged at the third metal layer 53. Besides, the orthographic projection of the signal lines, which are arranged at the third metal layer 53, onto the base substrate 50 overlaps, at least partially, with the orthographic projection of the transistor M5 in the gate driving circuit projected onto the base substrate 50.

In a further embodiment, a scan line 511 is arranged in the display region 5A. The extension direction of the above-mentioned signal line is perpendicular to the extension direction of the scan line. The scan line 511 and the gate electrode of the transistor M5 in the non-display region may be arranged at a same layer.

Furthermore, the non-display region 5B further comprises a first insulation layer 54 arranged between the second metal layer 52 and the third metal layer 53. The first insulation layer 54 is provided with a first through-hole 541, through which the signal lines (i.e., the metal lines 531, 532, and 533) in the gate driving circuit may be connected to the source electrode 521 or the drain electrode 522 of the transistor M5 (FIG. 5 merely schematically shows that the signal line 531 is connected to the source electrode 521 of the transistor M5 via the first through-hole 541).

In practical applications, the orthographic projection 510 of the transistor M5 in the non-display region projected onto the base substrate may be the orthographic projection of a plurality of transistors in the non-display region 5B onto the base substrate 50, and the orthographic projection 520 of the signal lines 531, 532, and 533 onto the base substrate 50 may be the orthographic projection of one or more signal lines in the driving circuit onto the base substrate 50. The orthographic projection 510 of the transistor M5 onto the base substrate 50 may cover the orthographic projection 520 of the metal lines 531, 532, and 533 onto the base substrate 50.

It can be viewed from FIG. 5 that the array substrate 500 as provided in this embodiment further reduces the width occupied by the metal line and the transistor in the non-display region in the direction of the scan line. This width reduction is due to the third metal layer 53 is arranged at the side of the metal layer provided with the source electrode and the drain electrode of the transistor M5 away from the base substrate. The width reduction is also due to at least one of the signal lines 531, 532, and 533 in the gate driving circuit is arranged at the third metal layer. Therefore, the width of the display border is reduced with the size of the circuit elements unchanged.

Figure 6:
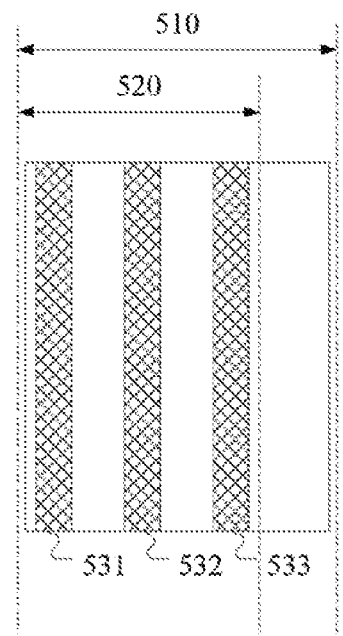
FIG. 6 is a schematic view of an orthographic projection of the non-display region of the array substrate shown in FIG. 5 projected onto the base substrate.

Reference is further made to FIG. 6, which is a schematic view of an orthographic projection of the non-display region of the array substrate shown in FIG. 5 onto the base substrate. As shown in FIG. 6, the orthographic projection 510 of the transistor M5 onto the base substrate 50 overlaps with the orthographic projection 520 of the metal lines 531, 532, and 533 onto the base substrate. The total width of the border occupied by the transistor M5 and the metal lines 531, 532, and 533 equals to the width of the orthographic projection 510 of the transistor M5. Compared with the solution in the prior art of arranging the source electrode and the drain electrode of the transistor, the signal lines, and the common electrode line at a same metal layer in parallel, the disclosure effectively reduces the total width of the border occupied by the transistor and the metal line in the non-display region.

In some embodiments, data lines are arranged in the display region of the array substrate, and the above-mentioned driving circuit comprises multiplexers. Each of the multiplexers is connected to a plurality of data lines. The multiplexer comprises a transistor and a third clock signal line, and are used for transmitting data signals successively to the data lines connected to the multiplexer controlled by signal inputted via the third clock signal line.

Specifically, the multiplexer may comprise N transistors and N third clock signal lines, wherein the gate electrode of each transistor is respectively connected to one third clock signal line. The source electrode of each transistor is connected to an input end of the multiplexers. The drain electrode of each transistor is respectively connected to one data line. The number N mentioned above is a positive integer. The N transistors in the multiplexer are sequentially turned on under the control of clock signals transmitted via the N third clock signal lines. Therefore, the signals inputted from the input end of the multiplexer are sequentially transferred to each data line.

Figure 7:
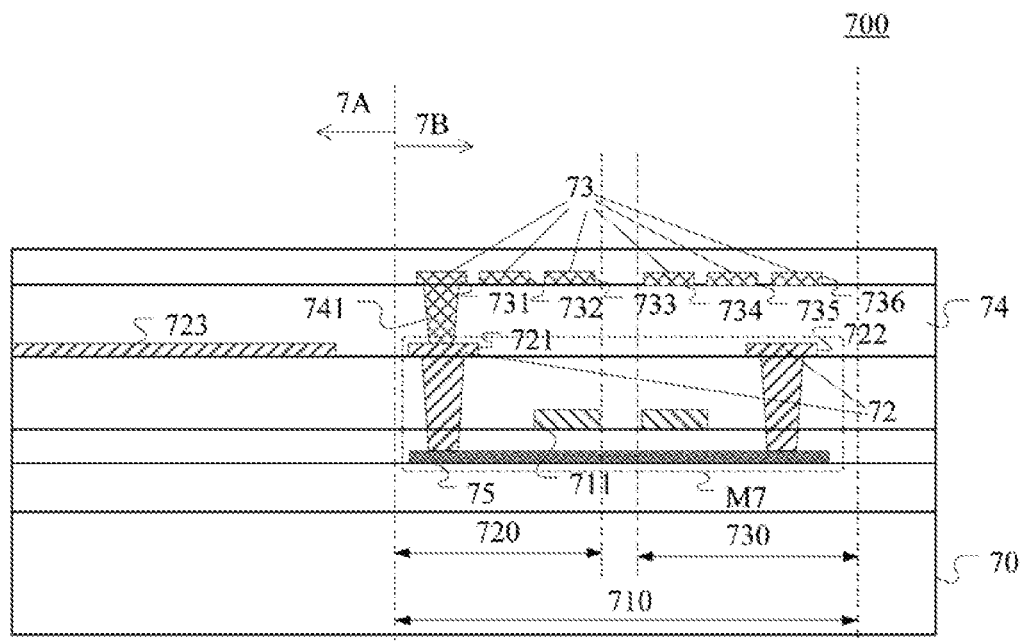
FIG. 7 is a schematic view of a cross-sectional structure of an array substrate according to still another embodiment of the disclosure.

Reference is made to FIG. 7, which is a schematic view of a cross-sectional structure of an array substrate according to still another embodiment of the disclosure. As shown in FIG. 7, the array substrate 700 comprises a display region 7A and a non-display region 7B. The non-display region 7A comprises a first metal layer 71, a second metal layer 72, and a third metal layer 73. A multiplexer is arranged in the non-display region 7B. The multiplexer comprises: a transistor M7; and signal lines 731, 732, 733, 734, 735, and 736. Herein, the signal lines 731, 732, 733, 734, 735, and 736 may comprise a third clock signal line. The gate electrode 711 of the transistor M7 is located in the first metal layer 71. The source electrode 721 and the drain electrode 722 of the transistor M7 are located in the second metal layer 72. The signal lines 731, 732, 733, 734, 735, and 736 are located in the third metal layer. A data line 723 is arranged in the display region 7A. The data line 723 is arranged at the same layer as the source electrode 721 and the drain electrode 722 of the transistor M7 in the non-display region 7B. Alternatively, the transistor M7 is a polysilicon thin film transistor. In such a case, the transistor M7 further comprises a polysilicon layer 75.

In this embodiment, the signal lines 731, 732, 733, 734, 735, and 736 may comprise one or more groups of the third clock signal lines. For example, the signal lines 731, 732, 733, 734, 735, and 736 in FIG. 7 comprise two groups of the third clock signal lines. The first group of the third clock signal lines comprises the signal lines 731, 732, and 733, and the second group of the third clock signal lines comprises the signal lines 734, 735, and 736.

The orthographic projection 710 of the transistor M7 onto the base substrate 70 overlaps, at least partially, with the orthographic projection 720 of the first group of the third clock signal lines 731, 732, and 733 onto the base substrate and the orthographic projection 730 of the second group of the third clock signal lines 734, 735, and 736 onto the base substrate. Furthermore, the orthographic projection 710 of the transistor M7 onto the base substrate 70 overlaps, at least partially, with the orthographic projection 720 of the first group of the third clock signal lines 731, 732, and 733 onto the base substrate and the orthographic projection 730 of the second group of the third clock signal lines 734, 735, and 736 onto the base substrate in a direction perpendicular to the extension direction of the signal lines 731, 732, 733, 734, 735, and 736.

The non-display region 7B further comprises a first insulation layer 74 arranged between the second metal layer 72 and the third metal layer 73. The first insulation layer 74 is provided with a first through-hole 741, through which the signal lines 731, 732, 733, 734, 735, and 736 may be connected to the source electrode 721 or the drain electrode 722 of the transistor M7 (FIG. 7 merely schematically shows that the signal line 731 is connected to the source electrode 721 of the transistor M7 via the first through-hole 741).

Different from the embodiment shown in FIG. 5, in the embodiment shown in FIG. 7, the signal lines in the multiplexer for providing signals to the data lines are arranged at a different metal layer from the layer at which the source electrode and the drain electrode of the transistor are arranged. The extension direction of the signal lines 731, 732, 733, 734, 735, and 736 is perpendicular to the extension direction of the data lines. The multiplexer is usually located in one side or two sides of the display region along the direction of the data lines. Since the signal lines in the multiplexer are arranged at a different metal layer from of the layer at which the source electrode and the drain electrode of the transistor are arranged, and the orthographic projection of the signal lines onto the base substrate overlaps, partially or completely, with the orthographic projection of the transistor onto the base substrate, the array substrate 700 described in the above-mentioned embodiment of the disclosure can effectively reduce the size of the display screen border in the direction of data lines.

Figure 8:
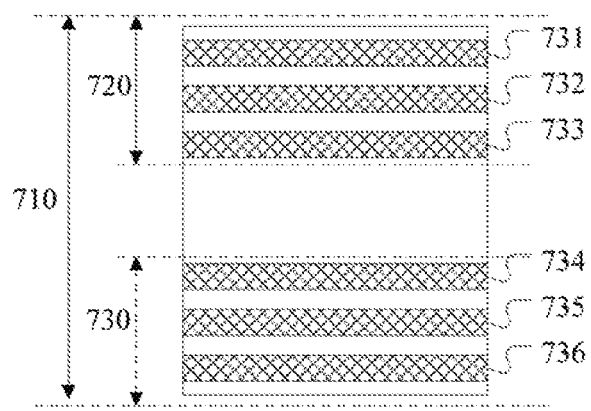
FIG. 8 is a schematic view of an orthographic projection of the non-display region of the array substrate shown in FIG. 7 projected onto the base substrate.

Reference is further made to FIG. 8, which is a schematic view of an orthographic projection of the non-display region of the array substrate shown in FIG. 7 onto the base substrate. As shown in FIG. 8, the orthographic projection 710 of the transistor M7 onto the base substrate 70 overlaps with the orthographic projection 720 of the first group of the third clock signal lines (including the third clock signal lines 731, 732, and 733) onto the base substrate, and the orthographic projection 710 of the transistor M7 onto the base substrate 70 overlaps with the orthographic projection 730 of the second group of the third clock signal lines (including the third clock signal lines 734, 735, and 736) onto the base substrate. The orthographic projection 720 of the first group of the third clock signal lines onto the base substrate and the orthographic projection 730 of the second group of the third clock signal lines onto the base substrate may be located in two opposite regions of the orthographic projection 710 of the transistor M7 onto the base substrate 70.

It can be viewed from FIG. 8 that the total width of the border occupied by the transistor M7 and the metal lines 731, 732, 733, 734, 735, and 736 equals to the width of the orthographic projection 710 of the transistor M7. Compared with the solution in the prior art of arranging the source electrode and the drain electrode of the transistor, the signal lines, and the common electrode line at a same metal layer in parallel, the disclosure effectively reduces the width of the border occupied by the transistor and the metal line in the non-display region.

On the basis of the above-mentioned embodiment, a common electrode and a common electrode line may be further arranged in the non-display region of the array substrate. Herein, the common electrode is usually shape as a block with a large resistance and is used for providing a common voltage required for the display to the array substrate. The common electrode line is connected to the common electrode in parallel so as to reduce the resistance of the common electrode.

Figure 9:
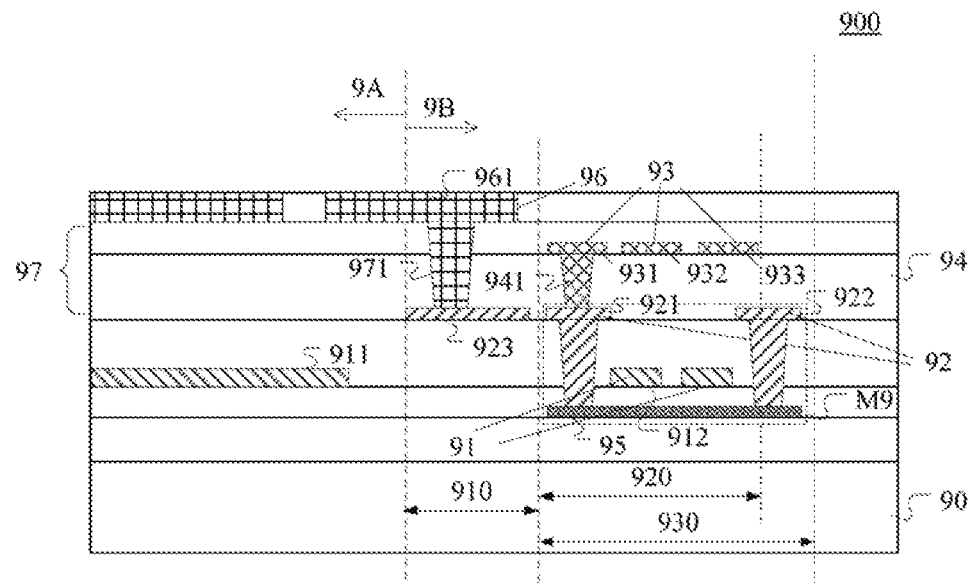
FIG. 9 is a schematic view of a cross-sectional structure of an array substrate according to yet another embodiment of the disclosure.

Reference is made to FIG. 9, which is a schematic view of a cross-sectional structure of an array substrate according to yet another embodiment of the disclosure. As shown in FIG. 9, the array substrate 900 may comprise a display region 9A and a non-display region 9B. The non-display region 9B comprises: a base substrate 90; and a first metal layer 91, a second metal layer 92, a third metal layer 93, and a common electrode layer 96 arranged in a direction perpendicular to the base substrate 90. A gate driving circuit, a common electrode 961, and a common electrode line 923 are arranged in the non-display region 9B. The gate driving circuit comprises: a transistor M9; and signal lines 931, 932, and 933. Herein, the signal lines 931, 932, and 933 may comprise at least one of a first clock signal line, a second clock signal line, a first voltage signal line, a second voltage signal line, an input signal line, and a reset signal line.

A gate electrode 912 of the transistor M9 is located in the first metal layer 91. A source electrode 921 and a drain electrode 922 of the transistor M9 are located in the second metal layer 92. The signal lines 931, 932, and 933 are located in the third metal layer 93. The common electrode 961 is located in the common electrode layer 96, and the common electrode line 923 is located in the second metal layer 92. Alternatively, the transistor M9 is a polysilicon thin film transistor. In such a case, the transistor M9 further comprises a polysilicon layer 95. The common electrode line 923 has a first orthographic projection 910 on the base substrate 90. The signal lines 931, 932, and 933 have a second orthographic projection 920 on the base substrate 90. The transistor M9 has a third orthographic projection 930 on the base substrate 90. The second orthographic projection 920 overlaps with the third orthographic projection 930, or the third orthographic projection 930 covers the second orthographic projection 920.

Furthermore, the non-display region 9B further comprises a first insulation layer 94 arranged between the second metal layer 92 and the third metal layer 93. The first insulation layer 94 is provided with a first through-hole 941, through which the signal lines 931, 932, and 933 in the gate driving circuit may be connected to the source electrode 921 or the drain electrode 922 of the transistor M9 (FIG. 9 merely schematically shows that the signal line 931 is connected to the source electrode 921 of the transistor M9 via the first through-hole 941).

Furthermore, the display region 9A may comprise a scan line 911, which may be arranged at the same layer as the gate electrode 912 of the transistor M9 in the non-display region 9B. Alternatively, a second insulation layer 97 is provided between the common electrode layer 96 and the second metal layer 92. The second insulation layer 97 is provided with a second through-hole 971, through which the common electrode 961 is connected to the common electrode line 923.

Figure 10:
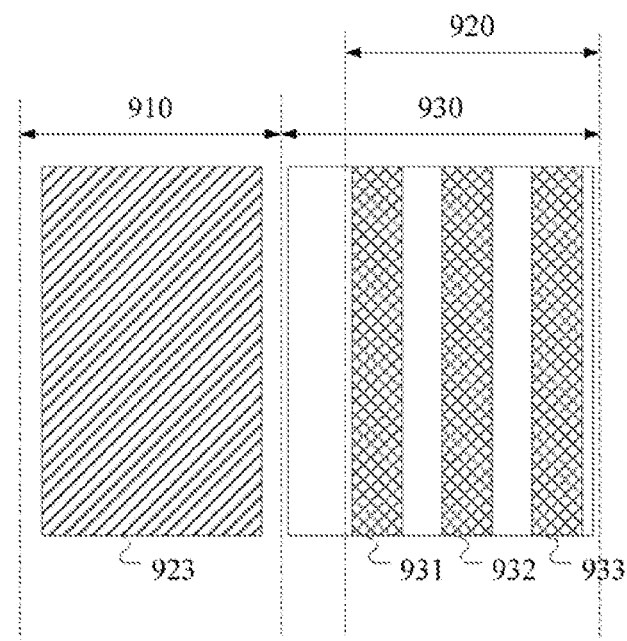
FIG. 10 is a schematic view of an orthographic projection of the non-display region of the array substrate shown in FIG. 9 projected onto the base substrate.

Reference is further made to FIG. 10, which is a schematic view of an orthographic projection of the non-display region of the array substrate shown in FIG. 9 onto the base substrate. As shown in FIG. 10, the common electrode line 923 has a first orthographic projection 910 on the base substrate 90. The signal lines 931, 932, and 933 have a second projection 920 on the base substrate. The transistor M9 has a third orthographic projection 930 on the base substrate 90. The third orthographic projection 930 overlaps with the second orthographic projection 920. The total width of the border occupied by the common electrode line 923, the transistor M9, and the signal lines 931, 932, and 933 equals to the sum of the widths of the first orthographic projection 910 and the third orthographic projection 930. Compared with the solution in the prior art of arranging the source electrode and the drain electrode of the transistor, the signal lines, and the common electrode line at a same metal layer in parallel, the disclosure effectively reduces the total width of the border occupied by the transistor and the metal line in the non-display region.

Different from the embodiment shown in FIG. 5, it can be viewed from FIG. 9 that the non-display region of the array substrate 900 in the embodiment shown in FIG. 9 may be further provided with a common electrode 961 and a common electrode line 923. The embodiment shown in FIG. 5 may be applied to a self-capacitance touch display panel, in which the common electrode is also used as a touch electrode. A touch electrode line is arranged in the display region. The touch electrode line may be used as a common electrode line connected to the common electrode in parallel so as to reduce the resistance of the common electrode. That is, the non-display region of the array substrate in the self-capacitance touch display panel does not require to be further provided with a common electrode line. However, in a non-touch display panel and a mutual-capacitance touch display panel, the non-display region may be provided with a common electrode line, i.e., the array substrate shown in FIG. 9 may be applied to the non-touch display panel and the mutual-capacitance touch display panel.

Figure 11:
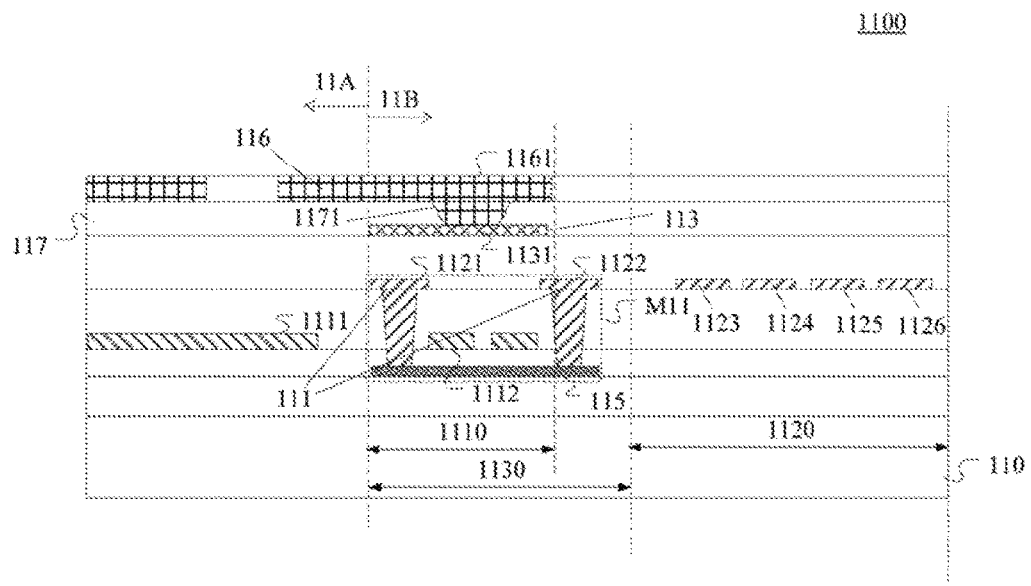
FIG. 11 is a schematic view of a cross-sectional structure of an array substrate according to yet another embodiment of the disclosure.

Reference is further made to FIG. 11, which is a schematic view of a cross-sectional structure of an array substrate according to yet another embodiment of the disclosure. As shown in FIG. 11, the array substrate 1100 may comprise a display region 11A and a non-display region 11B. The non-display region 11B comprises: a base substrate 110; and a first metal layer 111, a second metal layer 112, a third metal layer 113, and a common electrode layer 116 arranged in a direction perpendicular to the base substrate 110. A gate driving circuit, a common electrode 1161, and a common electrode line 1131 are arranged in the non-display region 11B. The gate driving circuit comprises: a transistor M11; and signal lines 1123, 1124, 1125, and 1126.

A gate electrode 1112 of the transistor M11 is located in the first metal layer 111. A source electrode 1121 and a drain electrode 1122 of the transistor M11 are located in the second metal layer 112. The signal lines 1123, 1124, 1125, and 1126 are located in the second metal layer 112. The common electrode 1161 is located in the common electrode layer 116. The common electrode line 1131 is located in the third metal layer 113. Alternatively, the transistor M11 is a polysilicon thin film transistor. In such a case, the transistor M11 further comprises a polysilicon layer 115. The common electrode line 1131 has a first orthographic projection 1110 on the base substrate 110. The signal lines 1123, 1124, 1125, and 1126 have a second orthographic projection 1120 on the base substrate 110. The transistor M11 has a third orthographic projection 1130 on the base substrate 110. The third orthographic projection 1130 covers the first orthographic projection 1110.

Furthermore, the display region 11A may comprise a scan line 1111 arranged at the same layer as the gate electrode 1112 of the transistor M11 in the non-display region 11B. Alternatively, a third insulation layer 117 is provided between the common electrode layer 116 and the third metal layer 113. The third insulation layer 117 is provided with a third through-hole 1171, through which the common electrode 1161 is connected to the common electrode line 1131.

Figure 12:
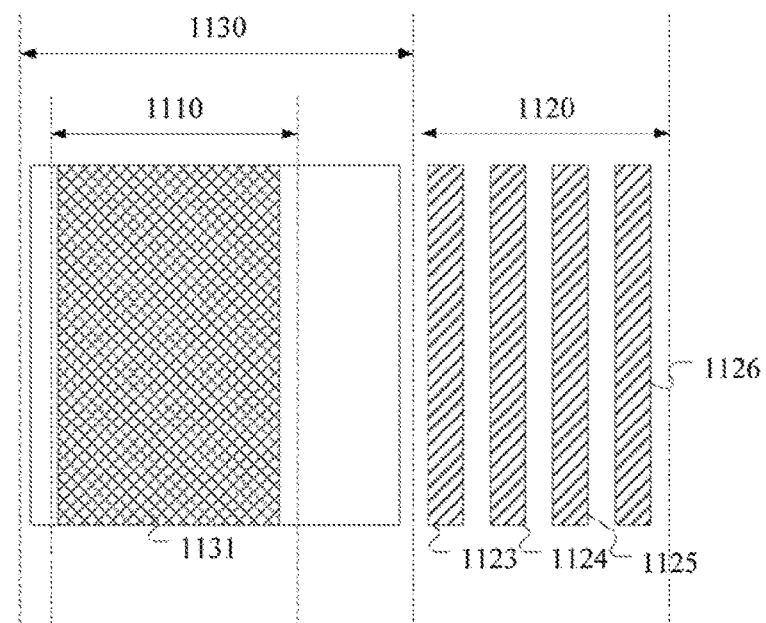
FIG. 12 is a schematic view of an orthographic projection of the non-display region of the array substrate shown in FIG. 11 projected onto the base substrate.

Reference is further made to FIG. 12, which is a schematic view of an orthographic projection of the non-display region of the array substrate shown in FIG. 11 onto the base substrate. As shown in FIG. 12, the common electrode line 1131 has a first orthographic projection 1110 on the base substrate 110. The signal lines 1123, 1124, 1125, and 1126 have a second projection 1120 on the base substrate. The transistor M11 has a third orthographic projection 1130 on the base substrate 110. The third orthographic projection 1130 covers the first orthographic projection 1110. The total width of the border occupied by the common electrode line 1131, the transistor M11, and the signal lines 1123, 1124, 1125, and 1126 equals to the sum of the widths of the second orthographic projection 1120 and the third orthographic projection 1130. Compared with the solution in the prior art of arranging the source electrode and the drain electrode of the transistor, the signal lines, and the common electrode line at a same metal layer in parallel, the disclosure effectively reduces the total width of the border occupied by the transistor and the metal line in the non-display region.

Figure 13:
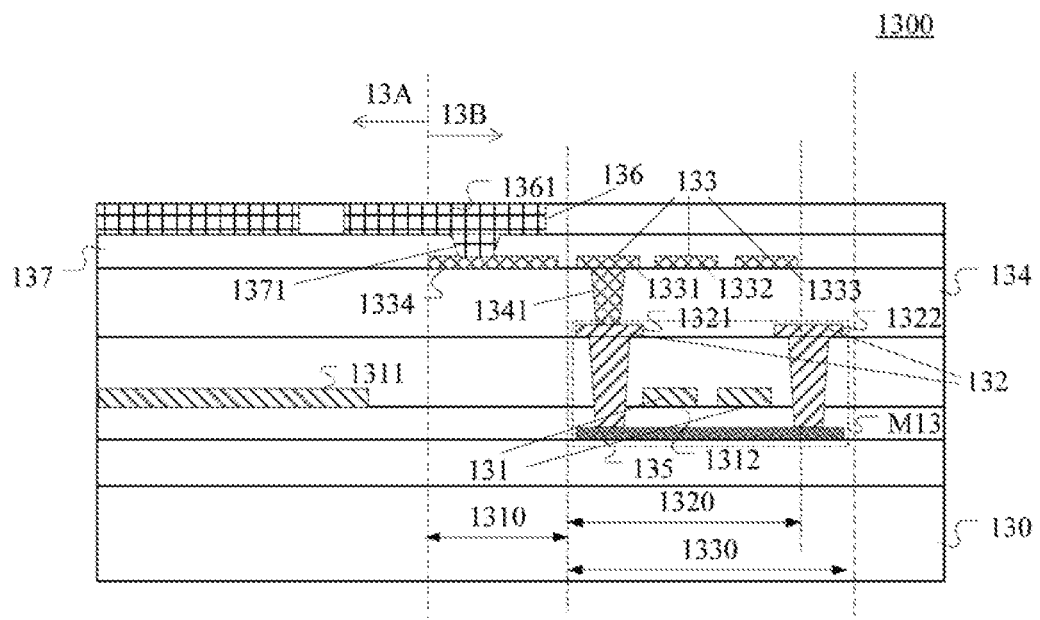
FIG. 13 is a schematic view of a cross-sectional structure of an array substrate according to yet another embodiment of the disclosure.

Reference is made to FIG. 13, which is a schematic view of a cross-sectional structure of an array substrate according to yet another embodiment of the disclosure. As shown in FIG. 13, the array substrate 1300 may comprise a display region 13A and a non-display region 13B. The non-display region 13B comprises: a base substrate 130; and a first metal layer 131, a second metal layer 132, a third metal layer 133, and a common electrode layer 136 arranged in a direction perpendicular to the base substrate 130. A gate driving circuit, a common electrode 1361, and a common electrode line 1334 are arranged in the non-display region 13B. The gate driving circuit comprises: a transistor M13; and signal lines 1331, 1332, and 1333.

A gate electrode 1312 of the transistor M13 is located in the first metal layer 131. A source electrode 1321 and a drain electrode 1322 of the transistor M13 are located in the second metal layer 132. The signal lines 1331, 1332, and 1333 are located in the third metal layer 133. The common electrode 1361 is located in the common electrode layer 136. The common electrode line 1334 is located in the third metal layer 133. Alternatively, the transistor M13 is a polysilicon thin film transistor. In such a case, the transistor M13 further comprises a polysilicon layer 135. The common electrode line 1334 has a first orthographic projection 1310 on the base substrate 130. The signal lines 1331, 1332, and 1333 have a second orthographic projection 1320 on the base substrate 130. The transistor M13 has a third orthographic projection 1330 on the base substrate 130. The third orthographic projection 1330 covers the second orthographic projection 1320.

Furthermore, the non-display region 13B further comprises a fourth insulation layer 134 arranged between the second metal layer 132 and the third metal layer 133. The fourth insulation layer 134 is provided with a fourth through-hole 1341, through which the signal lines 1331, 1332, and 1333 in the gate driving circuit may be connected to the source electrode 1321 or the drain electrode 1322 of the transistor M13 (FIG. 13 merely schematically shows that the signal line 1331 is connected to the source electrode 1321 of the transistor M13 via the fourth through-hole 1341). Furthermore, the display region 13A may comprise a scan line 1311, which may be arranged at the same layer as the gate electrode 1312 of the transistor M13 in the non-display region 13B. The extension direction of the signal lines 1331, 1332, and 1333 and the common electrode line 1334 is perpendicular to the scan line 1311. Alternatively, a fifth insulation layer 137 is provided between the common electrode layer 136 and the third metal layer 133. The fifth insulation layer 137 is provided with a fifth through-hole 1371, through which the common electrode 1361 is connected to the common electrode line 1334.

Figure 14:
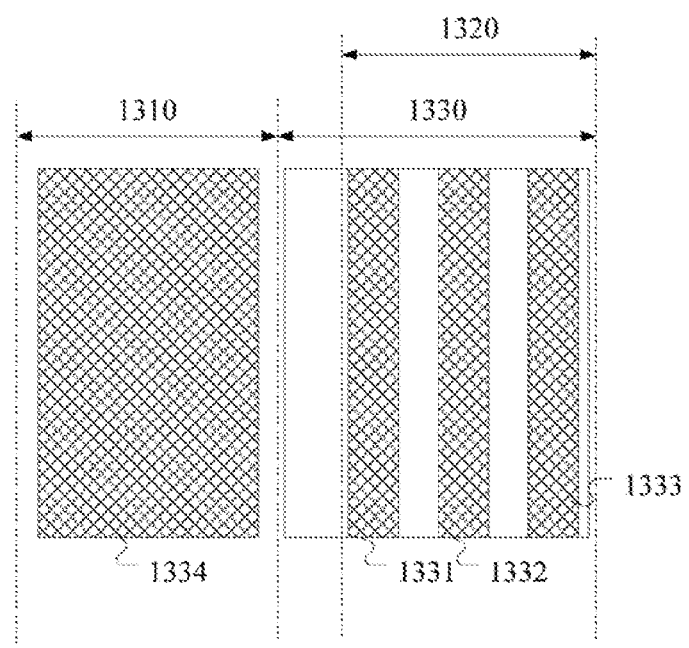
FIG. 14 is a schematic view of an orthographic projection of the non-display region of the array substrate shown in FIG. 13 projected onto the base substrate.

Reference is further made to FIG. 14, which is a schematic view of an orthographic projection of the non-display region of the array substrate shown in FIG. 13 onto the base substrate. As shown in FIG. 12, the common electrode line 1334 has a first orthographic projection 1310 on the base substrate 130. The signal lines 1331, 1332, and 1333 have a second projection 1320 on the base substrate. The transistor M13 has a third orthographic projection 1330 on the base substrate 130. The third orthographic projection 1330 covers the second orthographic projection 1320. The total width of the border occupied by the common electrode line 1331, the transistor M13, and the signal lines 1323, 1324, 1325, and 1326 equals to the sum of the widths of the first orthographic projection 1310 and the third orthographic projection 1330. Compared with the solution in the prior art of arranging the source electrode and the drain electrode of the transistor, the signal lines, and the common electrode line at a same metal layer in parallel, the disclosure effectively reduces the total width of the border occupied by the transistor and the metal line in the non-display region.

Figure 15:
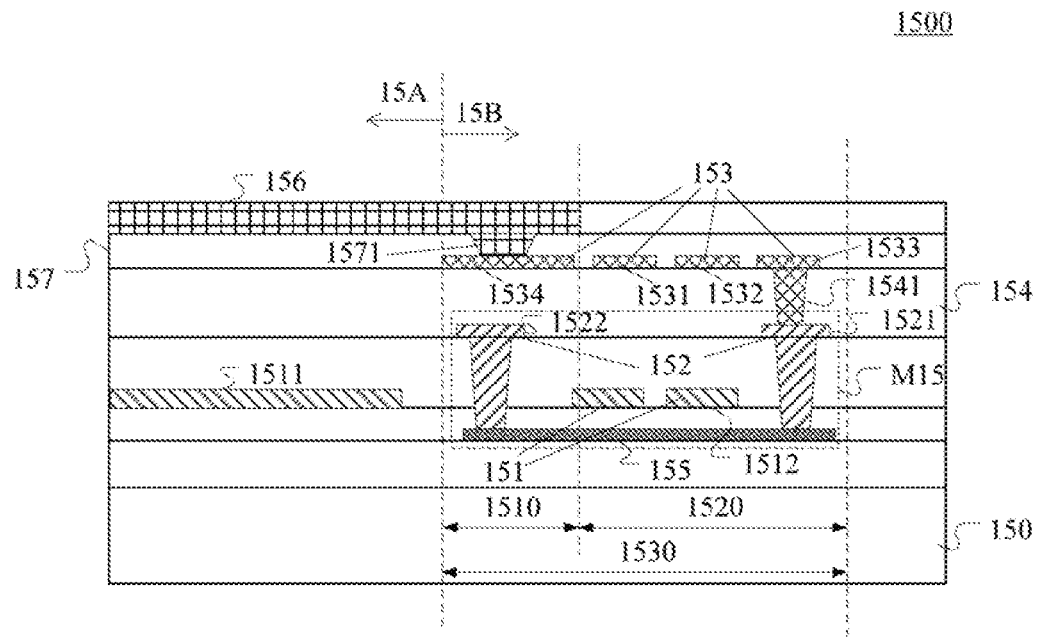
FIG. 15 is a schematic view of a cross-sectional structure of an array substrate according to yet another embodiment of the disclosure.

Reference is made to FIG. 15, which is a schematic view of a cross-sectional structure of an array substrate according to yet another embodiment of the disclosure. As shown in FIG. 15, the array substrate 1500 may comprise a display region 15A and a non-display region 15B. The non-display region 15B comprises: a base substrate 150; and a first metal layer 151, a second metal layer 152, a third metal layer 153, and a common electrode layer 156 arranged in a direction perpendicular to the base substrate 150. A gate driving circuit, a common electrode 1561, and a common electrode line 1534 are arranged in the non-display region 15B. The gate driving circuit comprises: a transistor M15; and signal lines 1531, 1532, and 1533.

A gate electrode 1512 of the transistor M15 is located in the first metal layer 151. A source electrode 1521 and a drain electrode 1522 of the transistor M15 are located in the second metal layer 152. The signal lines 1531, 1532, and 1533 are located in the third metal layer 153. The common electrode 1561 is located in the common electrode layer 156. The common electrode line 1534 is located in the third metal layer 153. Alternatively, the transistor M15 is a polysilicon thin film transistor. In such a case, the transistor M15 further comprises a polysilicon layer 155. The common electrode line 1534 has a first orthographic projection 1510 on the base substrate 150. The signal lines 1531, 1532, and 1533 have a second orthographic projection 1520 on the base substrate 150. The transistor M15 has a third orthographic projection 1530 on the base substrate 150. The third orthographic projection 1530 covers the first orthographic projection 1510 and the second orthographic projection 1520.

Furthermore, the non-display region 15B further comprises a sixth insulation layer 154 arranged between the second metal layer 152 and the third metal layer 153. The sixth insulation layer 154 is provided with a sixth through-hole 1541, through which the signal lines 1531, 1532, and 1533 in the gate driving circuit may be connected to the source electrode 1521 or the drain electrode 1522 of the transistor M15 (FIG. 15 merely schematically shows that the signal line 1533 is connected to the source electrode 1521 of the transistor M15 via the sixth through-hole 1541).

Furthermore, the display region 15A may comprise a scan line 1511 arranged at the same layer as the gate electrode 1512 of the transistor M15 in the non-display region 15B. The extension direction of the signal lines 1531, 1532, and 1533 and the common electrode line 1534 is perpendicular to the scan line 1511. Alternatively, a seventh insulation layer 157 is provided between the common electrode layer 156 and the third metal layer 153. The seventh insulation layer 157 is provided with a through-hole 1571, through which the common electrode 1561 is connected to the common electrode line 1534.

Figure 16:
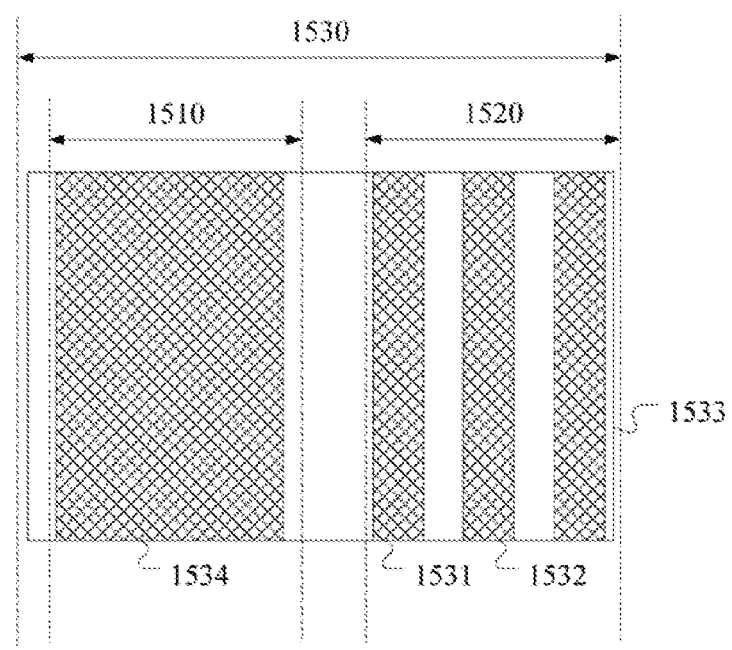
FIG. 16 is a schematic view of an orthographic projection of the non-display region of the array substrate shown in FIG. 15 projected onto the base substrate.

Reference is further made to FIG. 16, which is a schematic view of an orthographic projection of the non-display region of the array substrate shown in FIG. 15 onto the base substrate. As shown in FIG. 16, the common electrode line 1534 has a first orthographic projection 1510 on the base substrate 150. The signal lines 1531, 1532, and 1533 have a second projection 1520 on the base substrate. The transistor M15 has a third orthographic projection 1530 on the base substrate 150. The third orthographic projection 1530 covers the first orthographic projection 1510 and the second orthographic projection 1520. The total width of the border occupied by the common electrode line 1531, the transistor M15, and the signal lines 1523, 1524, 1525, and 1526 equals to the width of the third orthographic projection 1530. Thereby, the array substrate as provided in this embodiment further reduces the area of the border occupied by the metal line and the transistor in the non-display region, which may further reduce the width of the border.

An embodiment in accordance with the disclosure further provides a display panel, which comprises: the array substrate described in each of the embodiments mentioned above; and a color film substrate disposed opposite to the array substrate. It would be appreciated that the display panel may further comprise a liquid crystal layer arranged between the array substrate and the color film substrate.

An embodiment in accordance with the disclosure further provides a display device comprising the above-mentioned display panel. In a particular implementation, the display device may further comprise various structures, such as a backlight unit, a light guide plate, a transparent film, and the like.

The above description are only preferred embodiments of the disclosure and illustrations on the applied technical principles. It should be understood by one skilled in the art that the scope of the disclosure is not limited to the technical solutions constituted by particular combinations of the above-mentioned technical features, but should cover other technical solutions formed by any combinations of the above-mentioned technical features or equivalent features thereof without departing from the inventive concept of the disclosure. For example, the technical solutions formed by means of the replacement between the above-mentioned features and the technical features having similar functions as disclosed in (not limited to) the disclosure.

What is claimed is:

1. An array substrate, comprising:
   a display region, and a non-display region;
   the non-display region comprising:
   a base substrate; and
   a first metal layer, a second metal layer, and a third metal layer arranged in a direction perpendicular to the base substrate; and, wherein
   a transistor and a metal line are arranged in the non-display region;
   a gate electrode of the transistor is located in the first metal layer, and a source electrode and a drain electrode of the transistor are located in the second metal layer; the metal line is located in the third metal layer; and
   an orthographic projection of the transistor projected onto the base substrate overlaps, at least partially, with an orthographic projection of the metal line projected onto the base substrate,
   wherein a driving circuit is arranged in the non-display region such that the driving circuit comprising the transistor and a signal line, the signal line being used for transmitting signals to the transistor, and being included in the metal line, and
   wherein the non-display region further comprises a first insulation layer, the first insulation layer being located between the second metal layer and the third metal layer, wherein the first insulation layer is provided with a first through-hole, and the signal line is connected to the source electrode or the drain electrode of the transistor through the first through-hole.

2. The array substrate of claim 1, wherein the driving circuit comprises a gate driving circuit, the gate driving circuit comprising a first clock signal line, a second clock signal line, a first voltage signal line, a second voltage signal line, an input signal line, and a reset signal line.

3. The array substrate of claim 2, wherein the signal line comprises at least one of the first clock signal line, the second clock signal line, the first voltage signal line, the second voltage signal line, the input signal line, and the reset signal line.

4. The array substrate of claim 3, wherein
   a scan line is arranged in the display region; and
   an extension direction of the signal line is perpendicular to an extension direction of the scan line.

5. The array substrate of claim 1, wherein
   data lines are arranged in the display region;
   the driving circuit comprises multiplexers, each of the multiplexers being connected to a multiplicity of the data lines, wherein the multiplexer comprises the transistor and a third clock signal line, is used for transmitting data signals successively to the multiplicity of the data lines connected to the multiplexer controlled by signal inputted via the third clock signal line.

6. The array substrate of claim 4, wherein the signal line comprises a third clock signal line.

7. The array substrate of claim 6, wherein the extension direction of the signal line is perpendicular to an extension direction of the data lines.

8. The array substrate of claim 1, wherein
   a common electrode and a common electrode line are further arranged in the non-display region, the non-display region further comprising a common electrode layer; and
   the common electrode is located in the common electrode layer, the common electrode being connected to the common electrode line.

9. The array substrate of claim 8, wherein
   the common electrode line is located in the second metal layer;
   a second insulation layer is provided between the common electrode layer and the second metal layer; and
   the second insulation layer is provided with a second through-hole, the common electrode connected to the common electrode line through the second through-hole.

10. The array substrate of claim 8, wherein the metal line comprises the common electrode line.

11. The array substrate of claim 10, wherein
the common electrode line has a first orthographic projection on the base substrate;
the signal line has a second orthographic projection on the base substrate; and
the transistor has a third orthographic projection on the base substrate;
the first orthographic projection or the second orthographic projection overlapping, at least partially, with the third orthographic projection.

12. The array substrate of claim 11, wherein
the third orthographic projection covers the first orthographic projection;
a third insulation layer is provided between the common electrode layer and the third metal layer; and
the third insulation layer is provided with a third through-hole, the common electrode connected to the common electrode line through the third through-hole.

13. The array substrate of claim 11, wherein
the third orthographic projection covers the second orthographic projection;
a fourth insulation layer is provided between the second metal layer and the third metal layer;
the fourth insulation layer is provided with a fourth through-hole, the source electrode or the drain electrode of the transistor connected to the signal line through the fourth through-hole;
a fifth insulation layer is provided between the common electrode layer and the third metal layer; and
the fifth insulation layer is provided with a fifth through-hole, the common electrode connected to the common electrode line through the fifth through-hole.

14. The array substrate of claim 11, wherein:
the third orthographic projection covers the first orthographic projection and the second orthographic projection;
a sixth insulation layer is provided between the second metal layer and the third metal layer;
the sixth insulation layer is provided with a sixth through-hole, the source electrode or the drain electrode of the transistor connected to the signal line through the sixth through-hole;
a seventh insulation layer is provided between the common electrode layer and the third metal layer; and
the seventh insulation layer is provided with a seventh through-hole, the common electrode is connected to the common electrode line through the seventh through-hole.

15. A display panel, comprising:
the array substrate of claim 1; and
a color film substrate disposed opposite to the array substrate.

16. A display device comprising the display panel of claim 15.

* * * * *